US007982396B2

(12) United States Patent
Cok

(10) Patent No.: US 7,982,396 B2
(45) Date of Patent: Jul. 19, 2011

(54) LIGHT-EMITTING DEVICE WITH LIGHT-SCATTERING PARTICLES AND METHOD OF MAKING THE SAME

(75) Inventor: Ronald S. Cok, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 333 days.

(21) Appl. No.: 11/757,719

(22) Filed: Jun. 4, 2007

(65) Prior Publication Data
US 2008/0297045 A1 Dec. 4, 2008

(51) Int. Cl.
H01L 51/52 (2006.01)
H05B 33/26 (2006.01)
H05B 33/28 (2006.01)
H05B 33/10 (2006.01)

(52) U.S. Cl. ............. 313/506; 313/504; 427/66; 445/24

(58) Field of Classification Search .............. 313/110, 313/112, 116, 117, 498–512, 113–115; 427/66; 445/24
See application file for complete search history.

(56) References Cited

U.S. PATENT DOCUMENTS

| 4,476,292 A | 10/1984 | Ham et al. |
| 4,769,292 A | 9/1988 | Tang et al. |
| 5,061,569 A | 10/1991 | Vanslyke et al. |
| 5,247,190 A | 9/1993 | Friend et al. |
| 5,955,837 A | 9/1999 | Horikx et al. |
| 6,392,340 B2 | 5/2002 | Yoneda et al. |
| 6,635,363 B1 * | 10/2003 | Duclos et al. ................. 428/690 |
| 6,777,871 B2 | 8/2004 | Duggal et al. |
| 6,787,796 B2 | 9/2004 | Do et al. |
| 6,812,637 B2 | 11/2004 | Cok |
| 6,998,775 B2 * | 2/2006 | Sugiura et al. ................. 313/512 |
| 2001/0026124 A1 | 10/2001 | Liu et al. |
| 2002/0011783 A1 | 1/2002 | Hosokawa et al. |
| 2004/0041517 A1 * | 3/2004 | Watanabe et al. ............. 313/501 |
| 2004/0061136 A1 | 4/2004 | Tyan et al. |
| 2004/0217702 A1 | 11/2004 | Garner et al. |
| 2004/0253427 A1 * | 12/2004 | Yokogawa et al. ........... 428/212 |

(Continued)

FOREIGN PATENT DOCUMENTS
WO 2002/037580 5/2002
(Continued)

OTHER PUBLICATIONS

Mueller et al., Multicolor Light-Emitting Diodes based on Semiconductor Nanocrystals Encapsulated in GaN Charge Injection Layers, Nano Letters, vol. 5 No. 6, 2005, pp. 1039-1045.*

(Continued)

*Primary Examiner* — Peter J Macchiarolo
*Assistant Examiner* — Steven Horikoshi
(74) *Attorney, Agent, or Firm* — McKenna Long & Aldridge LLP

(57) ABSTRACT

A light-emitting device, including a substrate and a first electrode formed over the substrate. A light-emitting layer is formed over the first electrode. A second electrode is formed over the light-emitting layer. At least one of the first and second electrodes is transparent. A light-scattering layer comprising electrically-conductive, light-scattering particles is located in physical and electrical contact with the first or second electrode. The light-scattering layer is formed on a side of the first or second electrode, and opposite the light-emitting layer.

16 Claims, 8 Drawing Sheets

U.S. PATENT DOCUMENTS

2005/0018431 A1     1/2005    Shiang
2006/0049745 A1*   3/2006    Handa et al. .................. 313/503
2006/0186802 A1*   8/2006    Cok et al. ...................... 313/506

FOREIGN PATENT DOCUMENTS

WO        WO 02/37568      5/2002

OTHER PUBLICATIONS

U.S. Appl. No. 11/387,489, filed Mar. 23, 2006, Cok.

Tang et al., "Organic Electroluminescent Diodes", Applied Physics Letter, 51, 913-915, 1987.

Tang et al., "Electroluminescence of Doped Organic Thin Films," Journal of Applied Physics, 65, 3610-3616, 1989.

Safonov et al, "Modification of Polymer Light Emission by Lateral Microstructure", Synthetic Metals 116, pp. 145-148, 2001.

Lupton et al., "Bragg Scattering From Periodically Microstructured Light Emitting Diodes", Applied Physics Letters, vol. 77, No. 21, pp. 3340-3342, Nov. 20, 2000.

Tsutsui et al., "Sharply Directed Emission ni Organic Electroluminescent Diodes with an Optical-Microactivity Structure", Applied Physics Letters 65, No. 15, pp. 1868-1870, 1994.

* cited by examiner

LIGHT-EMITTING DEVICE WITH LIGHT-SCATTERING PARTICLES AND METHOD OF MAKING THE SAME

FIELD OF THE INVENTION

The present invention relates to light-emitting diode (LED) devices, and more particularly, to LED device structures for improving light output and lifetime of LED devices.

BACKGROUND OF THE INVENTION

Light-emitting diodes (LEDs) are a promising technology for flat-panel displays and area illumination lamps. The technology relies upon thin-film layers of organic or inorganic materials coated upon a substrate. Organic LED devices generally can have two formats known as small molecule devices such as disclosed in U.S. Pat. No. 4,476,292, issued Oct. 9, 1984 to Ham et al., and polymer OLED devices such as disclosed in U.S. Pat. No. 5,247,190, issued Sep. 21, 1993 to Friend et al. Alternatively, inorganic LED devices are known that employ quantum dots. Either type of LED device may include, in sequence, at least an anode, a light-emitting layer (EML), a cathode and an EL element. The EL element disposed between the anode and the cathode may also include a hole-injection layer (HIL), a hole-transporting layer (HTL), a hole-blocking layer, an electron-injection layer (EIL), an electron-transporting layer (ETL), and an electron-blocking layer. Holes and electrons recombine and emit light in the EL layer. Tang et al. (Applied Physics Letter, 51, 913 (1987), Journal of Applied Physics, 65, 3610 (1989), and U.S. Pat. No. 4,769,292) demonstrated highly efficient OLEDs using such a layer structure. Since then, numerous LEDs with alternative layer structures, including organic or polymeric materials, or inorganic materials, have been disclosed and device performance has improved.

Light is generated in an LED device when electrons and holes that are injected from the cathode and anode, respectively, flow through the electron transport layer (ETL) and the hole transport layer (HTL) and recombine in the emissive layer (EML). Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EML can determine how efficiently the electrons and holes are recombined for the emission of light.

LED devices can employ a variety of light-emitting materials patterned over a substrate that emit light of a variety of different frequencies, for example, red, green, and blue, to create a full-color display. However, patterned deposition is difficult, requiring, for example, expensive metal masks. Alternatively, it is known to employ a combination of emitters, or an unpatterned broad-band emitter to emit white light together with patterned color filters, for example, red, green, and blue, to create a full-color display. The color filters may be located on the substrate, for a bottom-emitter, or on the cover, for a top-emitter. For example, U.S. Pat. No. 6,392,340, issued May 21, 2002 to Yoneda et al., illustrates such a device. However, such designs are relatively inefficient, since approximately two-thirds of the light emitted may be absorbed by the color filters.

It has been found that one of the key factors that limits the efficiency of LED devices is the inefficiency in extracting the photons generated by the electron-hole recombination out of the LED devices. Due to the relatively high optical indices of the EML and transparent electrode materials used, most of the photons generated by the recombination process are actually trapped in the devices due to total internal reflection. These trapped photons never leave the LED devices and make no contribution to the light output from these devices. Because light is emitted in all directions from the internal layers of the LED, some of the light emits directly from the device, and some is emitted into the device and is either reflected back out or is absorbed, and some of the light is emitted laterally and trapped and absorbed by the various layers comprising the device. In general, up to 80% of the light may be lost in this manner.

A typical LED device uses a glass substrate, a transparent conducting anode such as indium-tin-oxide (ITO), a stack of organic or inorganic layers, and a reflective cathode layer. Light generated from such a device may be emitted through the glass substrate. This is commonly referred to as a bottom-emitting device. Alternatively, an LED device can include a substrate, a reflective anode, a stack of organic layers, and a top transparent cathode layer. Light generated from such an alternative device may be emitted through the top transparent electrode. This is commonly referred to as a top-emitting device. In typical organic devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions.

In any of these LED structures, the problem of trapped light remains. Referring to FIG. 9a, a bottom-emitting LED device as known in the prior art is illustrated having a substrate 10 (in this case transparent), a transparent first electrode 12, one or more layers of light-emitting material 14, a reflective second electrode 16, a gap 19 and a cover 20. First electrode 12, the one or more layers of light-emitting material 14, and reflective second electrode 16 form a light-emitting EL element. The gap 19 is typically filled with desiccating material. Light emitted from one of the material layers 14 can be emitted directly out of the device, through the transparent substrate 10, as illustrated with light ray 1. Light may also be emitted and internally guided in the transparent substrate 10 and material layers 14, as illustrated with light ray 2. Additionally, light may be emitted and internally guided in the layers of material 14, as illustrated with light ray 3. Light rays 4 emitted toward the reflective electrode 16 are reflected by the reflective first electrode 12 toward the substrate 10 and follow one of the light ray paths 1, 2, or 3. In some prior-art embodiments, the electrode 16 may be opaque and/or light absorbing. The bottom-emitter embodiment shown may also be implemented in a top-emitter configuration with a transparent cover and top electrode.

A variety of techniques have been proposed to improve the out-coupling of light from thin-film light-emitting devices. For example, diffraction gratings have been proposed to control the attributes of light emission from thin polymer films by inducing Bragg scattering of light that is guided laterally through the Emissive Layers. See "Modification Of Polymer Light Emission By Lateral Microstructure" by Safonov et al., Synthetic Metals 116, 2001, pp. 145-148, and "Bragg Scattering From Periodically Microstructured Light Emitting Diodes" by Lupton et al., Applied Physics Letters, Vol. 77, No. 21, Nov. 20, 2000, pp. 3340-3342. Brightness enhancement films having diffractive properties and surface and volume diffusers are described in WO2002/037568 entitled, "Brightness and Contrast Enhancement of Direct View Emissive Displays" by Chou et al., published May 10, 2002. The use of micro-cavity techniques is also known; for example, see "Sharply Directed Emission In Organic Electroluminescent Diodes With Optical-Microcavity Structure" by Tsutsui et al., Applied Physics Letters 65, No. 15, Oct. 10, 1994, pp. 1868-1870. However, none of these approaches cause all, or nearly all, of the light produced to be emitted from the device.

Chou, in WO2002/037580 and Liu et al. in U.S. Patent Publication 2001/0026124, taught the use of a volume or surface scattering layer to improve light extraction. The scattering layer is applied next to the organic layers or on the outside surface of the glass substrate and has an optical index that matches these layers. Light emitted from the OLED device at higher than a critical angle that would have otherwise been trapped can penetrate into the scattering layer and be scattered out of the device. The efficiency of the OLED device is thereby improved, but still has deficiencies as explained below.

U.S. Pat. No. 6,787,796 entitled, "Organic Electroluminescent Display Device And Method Of Manufacturing The Same", issued Sep. 7, 2004 to Do et al., describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light-loss preventing layer having different refractive index areas is formed between layers of the organic EL device having a large difference in refractive index among the respective layers. U.S. Publication 2004/0217702 entitled, "Light Extracting Designs For Organic Light Emitting Diodes", published Nov. 4, 2004 by Garner et al., similarly discloses use of microstructures to provide internal refractive index variations or internal or surface physical variations that function to perturb the propagation of internal waveguide modes within an LED. Garner et al. discloses the use of an index-matched polymer adjacent the encapsulating cover for a top-emitter embodiment.

Light-scattering layers, used externally to an OLED device, are described in U.S. Publication 2005/0018431 entitled, "Organic Electroluminescent Devices Having Improved Light Extraction", published Jan. 27, 2005, by Shiang and U.S. Pat. No. 5,955,837, issued Sep. 21, 1999, by Horikx, et al. These disclosures describe and define properties of scattering layers located on a substrate in detail. Likewise, U.S. Pat. No. 6,777,871, issued Aug. 17, 2004, by Duggal et al., describes the use of an output coupler comprising a composite layer having specific refractive indices and scattering properties. While useful for extracting light, this approach will only extract light that propagates in the substrate (illustrated with light ray 2), and will not extract light that propagates only through the organic layers and electrodes (illustrated with light ray 3).

However, scattering techniques, by themselves, may cause light to pass through the light-absorbing material layers multiple times where they are absorbed and converted to heat. Moreover, trapped light may propagate a considerable distance horizontally through the cover, substrate, or organic layers before being scattered out of the device, thereby reducing the sharpness of the device in pixelated applications such as displays. For example, a pixelated bottom-emitting LED device may include a plurality of independently controlled sub-pixels (as shown in FIG. 9b) and a light-scattering layer 22 located on the substrate 10. A light ray 2, 3, or 4 emitted from the light-emitting layer 22 may be scattered multiple times by the scattering layer 22, while traveling through the substrate 10, organic layer(s) 14, and transparent first electrode 12 before it is emitted from the device. When the light ray 2, 3, or 4 is finally emitted from the device, the light ray 2, 3, or 4 may have traveled a considerable distance through the various device layers from the original sub-pixel location where it originated to a remote sub-pixel where it is emitted, thus reducing sharpness. Most of the lateral travel occurs in the substrate 10, because that is by far the thickest layer in the package. Also, the amount of light emitted is reduced due to absorption of light in the various layers.

U.S. Patent Publication 2004/0061136 entitled, "Organic Light Emitting Device Having Enhanced Light Extraction Efficiency" by Tyan et al., describes an enhanced light extraction OLED device that includes a light-scattering layer. In certain embodiments, a low-index isolation layer (having an optical index substantially lower than that of the organic electroluminescent element) is employed adjacent to a reflective layer in combination with the light scattering layer to prevent low angle light from striking the reflective layer, and thereby minimize absorption losses due to multiple reflections from the reflective layer. The particular arrangements, however, may still result in reduced sharpness of the device.

Materials for forming the transparent electrode of top-emitting displays are well known in the art and include transparent conductive oxides (TCO's), such as indium tin oxide (ITO); thin layers of metal, such as Al, having a thickness on the order of 20 nm; and conductive polymers such as polythiophene. However, many electrode materials that are transparent, such as ITO, have low conductivity, which results in a voltage drop across the display. This in turn causes variable light output from the light emitting elements in the display, resistive heating, and power loss. Resistance can be lowered by increasing the thickness of the top electrode, but this decreases transparency.

One proposed solution to this problem is to use an auxiliary electrode above or below the transparent electrode layer and located between the pixels, as taught by US2002/0011783, published Jan. 31, 2002, by Hosokawa. The auxiliary electrode is not required to be transparent and therefore can be of a higher conductivity than the transparent electrode. The auxiliary electrode is typically constructed of conductive metals (Al, Ag, Cu, Au) that are also highly reflective. This results in incident light reflecting off the auxiliary electrode and thereby reducing the overall contrast ratio of the display. This makes the display less effective for use under high ambient light conditions, such as outdoors under bright sunshine.

As taught in issued U.S. Pat. No. 6,812,637 entitled, "OLED Display with Auxiliary Electrode" by Cok, an auxiliary electrode may be provided between the light-emitting areas of the LED to improve the conductivity of the transparent electrode 16 and enhance the current distribution to the LED. For example, a thick, patterned layer of aluminum or silver or other metals or metal alloys may be employed. However, such an arrangement does not improve the distribution of current within light-emitting areas. For devices, such as area illumination lamps that are expected to have large, light-emitting areas, such a solution is helpful but may not be adequate.

Commonly assigned U.S. application Ser. No. 11/387,489, filed Mar. 23, 2006, describes a multi-layer composite electrode for a light-emitting device, comprising: a transparent, conductive layer; a reflective, conductive layer in electrical contact with the transparent, conductive layer; and a light-scattering layer formed between the transparent, conductive layer and the reflective, conductive layer over only a first portion of the transparent, conductive layer, wherein the light-scattering layer is relatively less conductive than the reflective, conductive layer and the reflective, conductive layer is in electrical contact with the transparent, conductive layer over a second portion of the transparent, conductive layer where the light-scattering layer is not formed. Also disclosed is a method of making such a multi-layer composite electrode in a light emitting device, and an organic light-emitting diode (OLED) device comprising such a composite electrode. However, this solution likewise does not improve the distribution of current within the light-emitting area.

As taught in the prior art, light is trapped in the light-emitting layers of an LED device. The employment of a light-scattering layer on the substrate or cover of an LED device, as taught in the prior art, does not address this problem. Moreover, these prior-art LED devices require a transparent electrode having limited conductivity that further reduces light output and decreases the uniformity of the light output. Prior-art solutions such as auxiliary electrodes above or below a transparent electrode do not address the problem of conductivity within a light-emitting area.

SUMMARY OF THE INVENTION

In accordance with one embodiment, the invention is directed towards a light-emitting device, including a substrate and a first electrode formed over the substrate. A light-emitting layer is formed over the first electrode. A second electrode is formed over the light-emitting layer. At least one of the first and second electrodes is transparent. A light-scattering layer comprising electrically-conductive, light-scattering particles is located in physical and electrical contact with the first or second electrode. The light-scattering layer is formed on a side of the first or second electrode, and opposite the light-emitting layer.

Advantages

The present invention has the advantage that it increases the uniformity of light output and the efficiency of light output from an LED device and improves the sharpness of a pixilated LED device.

It will be understood that the figures are not to scale since the individual layers are too thin and the thickness differences of various layers too great to permit depiction to scale.

DETAILED DESCRIPTION OF THE INVENTION

Figure 1:
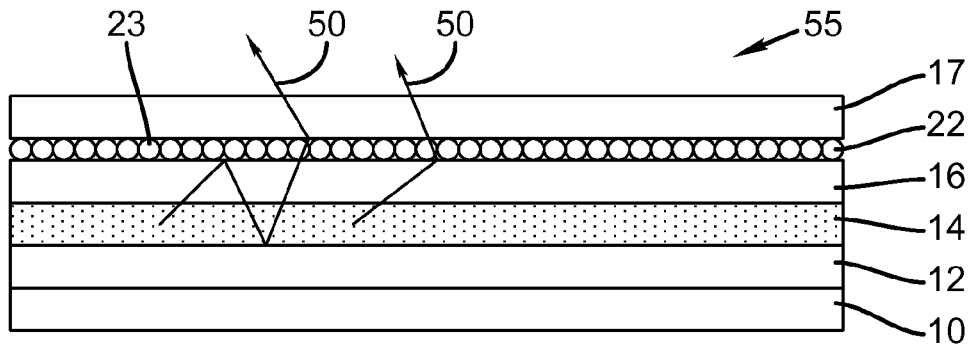
FIG. 1 is a partial cross section of a top-emitting LED having a light-scattering layer and electrically-conductive layer according to an embodiment of the present invention.

Referring to FIG. 1, in accordance with one embodiment of the present invention, a light-emitting device comprises a substrate 10, a first electrode 12 formed over the substrate 10, a light-emitting layer 14 formed over the first electrode 12, a second electrode 16 formed over the light-emitting layer 14, wherein at least one of the first and second electrodes 12, 16 is transparent; and a light-scattering layer 22 comprising electrically conductive, light-scattering particles 23 in physical and electrical contact with the first or second electrode 12, 16. The light-scattering layer 22 is formed on a side of the first or second electrode 12, 16, and opposite the light-emitting layer 14.

In various embodiments of the present invention, the light-emitting layer 14 comprises organic materials, for example, those employed in OLED devices. Alternatively inorganic light-emitting particles, for example, core/shell quantum dots in a semiconductor matrix, as taught in co-pending, commonly assigned U.S. Ser. No. 11/226,622 by Kahen, may be employed. The electrically conductive, light-scattering particles 23 may be metal oxide particles, for example, indium tin oxide particles. Applicants have employed particles of such material. Although layers of metal oxides are known in the prior art to provide transparent, conductive layers, such layers are uniform in composition and texture. In contrast, the present invention employs conductive particles, for example, irregularly shaped conductive particles, in a layer that is variable in composition, because of spaces or voids between the conductive particles in the layer; hence, a layer comprising such conductive particles is not uniform in composition and texture.

Figure 2:
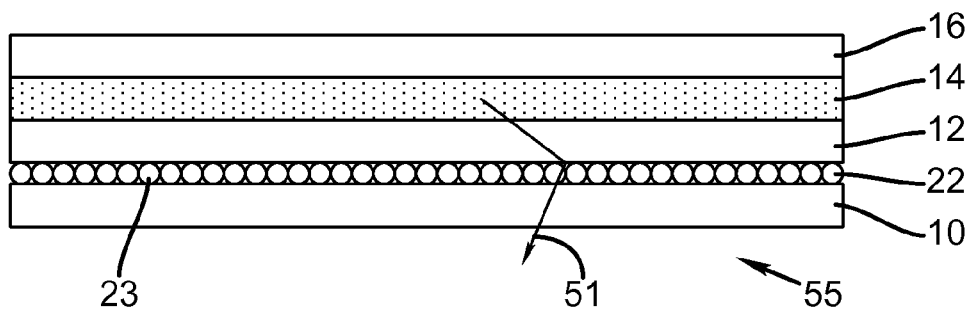
FIG. 2 is a partial cross section of a bottom-emitting LED having a light-scattering layer according to another embodiment of the present invention.

The present invention may be employed in either top- or bottom-emitter embodiments. FIG. 1 may employ a transparent second electrode 16 and a reflective first electrode 12 to emit light through the transparent second electrode 16 with top-emitting light ray 50. In this embodiment, the electrically conductive, light-scattering particles 23 are adjacent to, and in electrical contact with, the second transparent electrode 16. Referring to FIG. 2, a bottom-emitter device may employ a transparent substrate 10, transparent electrode 12, and reflective electrode 16 to emit light through the transparent electrode 12 with top-emitting light ray 51. In this embodiment, the electrically conductive, light-scattering particles 23 are adjacent to, and in electrical contact with, the first, transparent electrode 12. The electrically-conductive, light-scattering layer 22 may be located between the light-emitting layer 14 and the device side 55 through which light is emitted (as shown in FIGS. 1 and 2), or the electrically-conductive, light-scattering layer 22 may be opposite the light-emitting layer 14 and the device side 55 through which light is emitted (as shown in FIG. 3).

In operation, regardless of the embodiment, current supplied to the electrodes 12, 16 combines in the light-emitting layer 14 to cause the light-emitting layer 14 to emit light. The emitted light is either directly emitted from the device (e.g. as shown in FIG. 9a with light ray 1) or is scattered by the electrically-conductive, light-scattering layer 22 and eventually emitted or absorbed. The electrically-conductive, light-scattering layer 22 serves to further conduct current in the LED device, in particular when in electrical contact with the transparent electrode, since transparent electrodes (e.g. ITO) have reduced conductivity compared to reflective (e.g. metal) electrodes.

Figure 3:
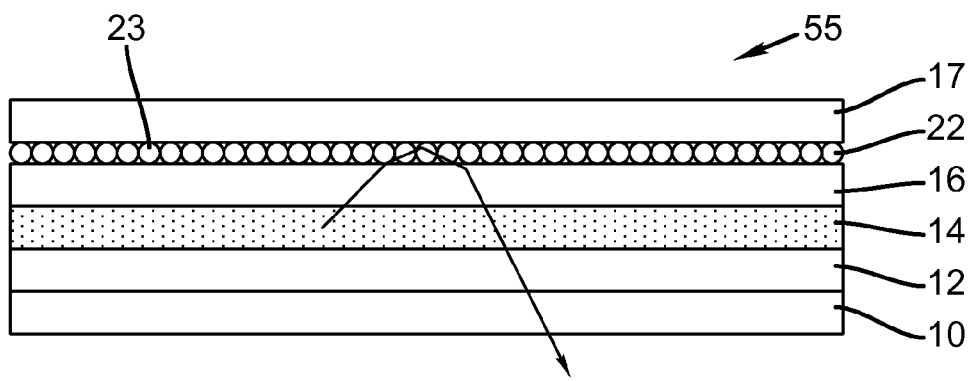
FIG. 3 is a partial cross section of a bottom-emitting LED having a light-scattering layer and electrically-conductive layer according to yet another embodiment of the present invention.

As shown in FIGS. 1 and 3, in an alternative embodiment of the present invention, an electrically-conductive layer 17 may be formed over or under the light-scattering layer 22. The electrically-conductive layer 17 may be reflective or transparent, depending on the location of the electrically-conductive layer 17 and whether the LED device is top- or bottom-emitting. As shown in FIG. 1, the electrically-conductive layer 17 may be transparent and the LED device a top-emitter device. As shown in FIG. 3, the electrically-conductive layer 17 may be reflective and the LED device a bottom-emitter device. The present invention provides a further improvement over the prior art when embodiments employing an additional electrically-conductive layer 17 are formed over or under the light-scattering layer 22.

Referring to FIG. 1 in an embodiment of the present invention, a transparent, electrically-conductive layer 17, comprising sputtered ITO layer for example, is coated over the scattering layer 22. The electrically-conductive layer 17 provides additional electrical conductivity over the LED device, while the electrically-conductive, light-scattering particles 23 conduct electricity to the adjacent electrode 16. In such an embodiment, the adjacent electrode 16 is typically transparent.

Referring to FIG. 3, a reflective layer 17, for example comprising an evaporated or sputtered metal layer of silver or aluminum or alloys thereof, is coated over the scattering layer 22. Layer 17 provides excellent electrical conductivity over the extent of the LED device, while the electrically-conductive, light-scattering particles 23 conduct electricity to the adjacent electrode (16 in FIG. 3). In such an embodiment, adjacent electrode 16 is typically transparent. In the absence of light-scattering layer 22 and electrically-conductive layer 17, a highly-conductive electrode 16 may be employed (for example, an evaporated or sputtered metal) but trapped light may not be emitted from the LED device. By providing a transparent electrode 16, a scattering layer 22, and an electrically-conductive layer 17 as prescribed in the current invention, current is effectively distributed through electrically-conductive layer 17 over the LED device to the transparent electrode and trapped light is effectively extracted from the LED device.

The optical indices of the light-emissive layer 14 and the transparent electrode affect the efficiency of light extraction. If the transparent electrode has an optical index lower than the optical index of the emissive layer, light may be trapped in the LED device, despite the presence of the scattering layer 22, since the light may totally internally reflect between the transparent electrode/emissive layer interface and a reflective electrode and never reach the light-scattering layer 22. In this case, light will be extracted by the scattering layer 22, only if the transparent electrode is very thin, e.g. less than 500 nm, preferably less than 100 nm, and even more preferably less than 50 nm. However, such thin layers do not conduct electricity well. Hence, in FIGS. 1 and 3 an additional, electrically-conductive layer 17 provides additional electrical conductivity while also enabling light scattering for either a top- or a bottom-emitting device.

If the transparent electrode has a higher optical index than the emissive layer, light may not be trapped and such limitations on the thickness of the transparent electrode may not be necessary. However, particularly in the case of the bottom-emitter of FIG. 3, an electrically-conductive layer 17 comprising a more highly conductive material, e.g. metal, may be useful. In a top-emitting embodiment (as illustrated in FIG. 4), if the optical index of the transparent electrode is greater than or equal to the optical index of the emissive layer 14, it may be simpler to increase the thickness of the transparent electrode itself, rather than providing an additional electrically-conductive layer 17, since a metal layer may not be transparent and may not be employed.

Figure 4A:
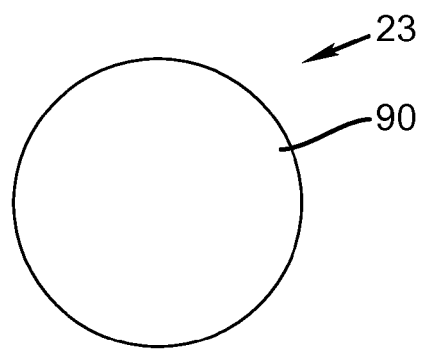
FIGS. 4a-4c are cross sections of various electrically-conductive, light-scattering particles according to various embodiments of the present invention.
Figure 4B:
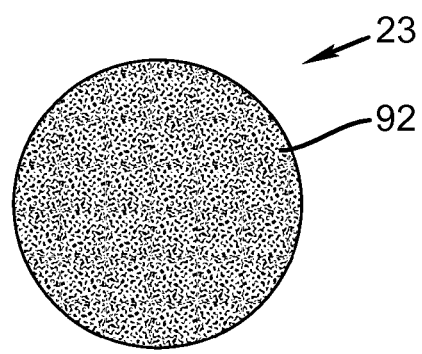
Figure 4C:
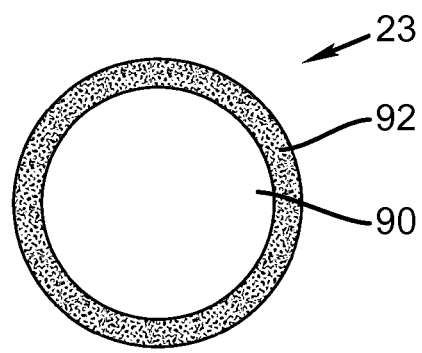

Referring to FIG. 4a, the electrically-conductive, light-scattering particles 23 comprising the electrically-conductive, light-scattering layer 22 may be transparent particles 90, for example, metal oxide particles such as indium tin oxide. Referring to FIGS. 4b and 4c, in various embodiments of the present invention, the electrically-conductive, light-scattering particles 23 may comprise reflective particles 92, for example metal particles (shown in FIG. 4b) or particles coated with metal (shown in FIG. 4c).

Preferably, the transparent electrically-conductive, light-scattering particles 90 have an optical index equal to or greater than the optical index of the light-emitting layer 14. Such optical indices promote the scattering of light incident on the scattering layer 22 by helping to defeat total internal reflection at the interface between the transparent electrode and the scattering layer 22.

Figure 5A:
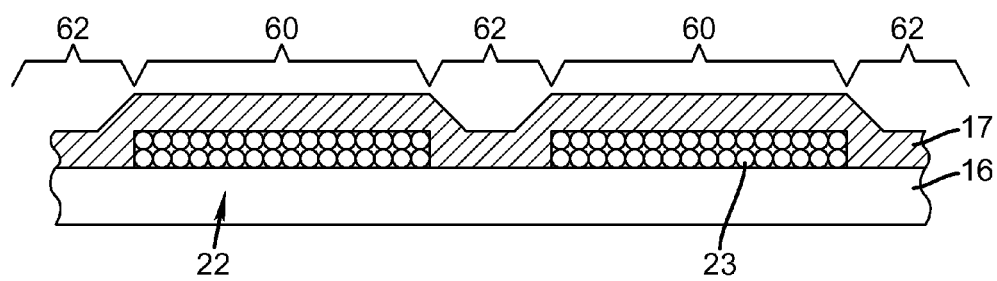
FIGS. 5a-5d are partial cross sections of a transparent electrode, patterned electrically-conductive, light-scattering layers, and an electrically-conductive layer according to various embodiments of the present invention.
Figure 5B:
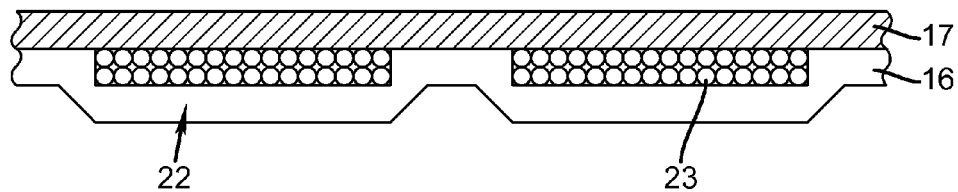
Figure 5C:
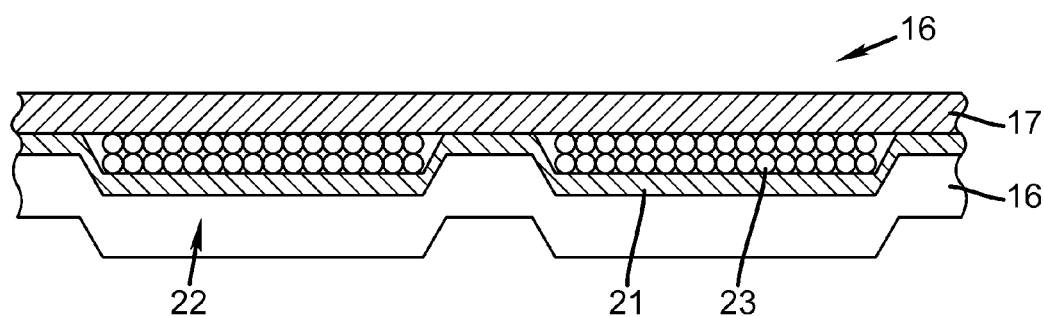
Figure 5D:
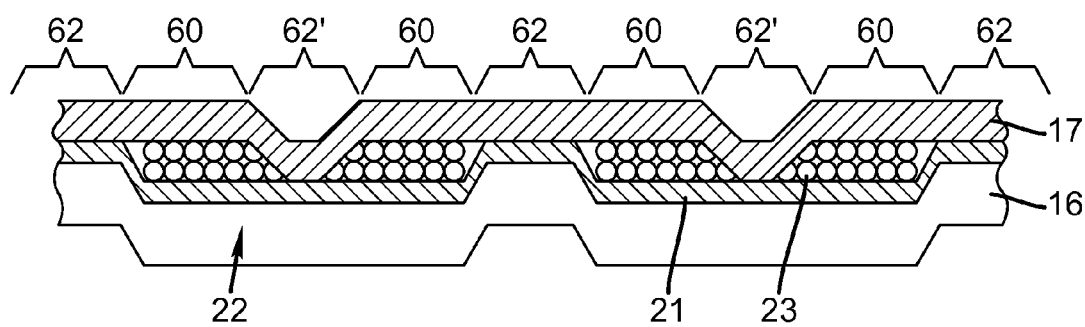
Figure 6A:
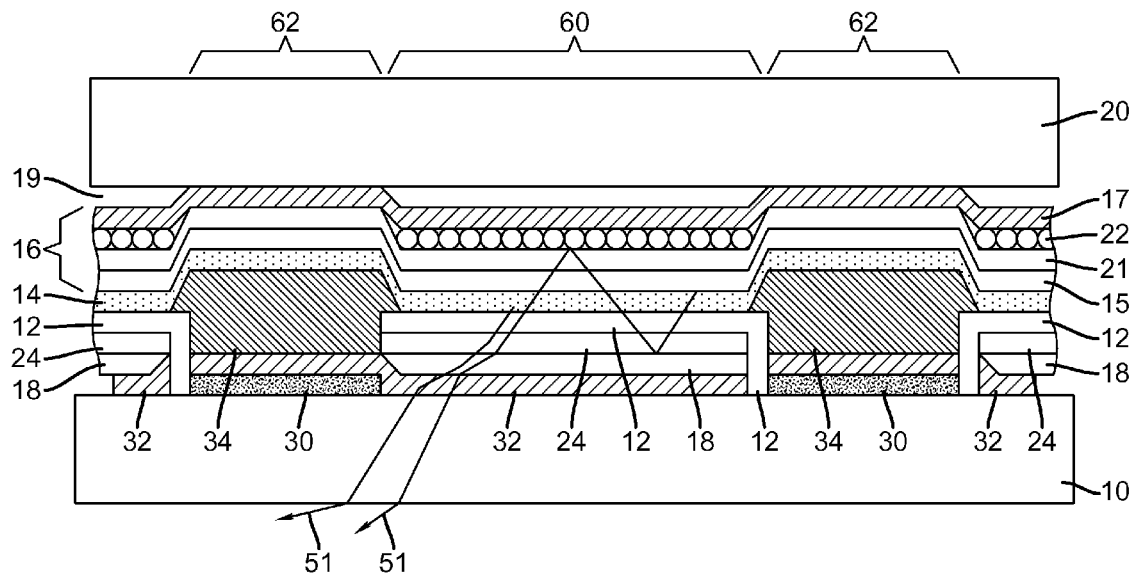
FIG. 6a is a partial cross section of a bottom-emitting LED device having a transparent electrode, patterned electrically-conductive, light-scattering layer, and an electrically-conductive layer according to an embodiment of the present invention.

Referring to FIGS. 5a-5d, in alternative embodiments of the present invention, the light-scattering layer 22 may be patterned over the transparent electrode. As shown in FIG. 5a, an electrically-conductive, light-scattering layer 22 is patterned on a transparent electrode 16. Areas 60 include electrically-conductive, light-scattering particles 23 and areas 62 do not include electrically-conductive, light-scattering particles 23. An electrically conductive layer 17 is coated over the electrically-conductive, light-scattering layer 22. By patterning the electrically-conductive, light-scattering layer 22, in areas 62 a direct electrical connection is made between the transparent electrode 16 and the electrically conductive layer 17, thereby enhancing current distribution to the transparent electrode 16. While, electrically-conductive, light-scattering layer 22 does conduct electricity as well, the materials typically employed in transparent conductors have a lower conductivity than layers made of such materials as metal. In FIG. 5a, the transparent electrode layer 16 is flat. In an alternative embodiment of the present invention, the transparent electrode 16 may have a structure defined, for example, by underlying layers on the substrate that assist in the patterning of the electrically-conductive, light-scattering layer 22, for example, by forming wells into which the electrically-conductive, light-scattering particles 23 may be sprayed or jetted. FIG. 5c illustrates the use of a conductive, protective layer 21. Such a layer may enhance the environmental robustness of the transparent electrode and/or any underlying layers. For the purposes of this invention, such additional conductive, protective layers may be considered to be part of the transparent electrode 16. As shown in FIG. 6d, the electrically-conductive, light-scattering layer 22 may be patterned as shown in both FIGS. 6a and 6b.

In various embodiments of the present invention, the transparent, conductive electrode may comprise a metal oxide, for example indium tin oxide (ITO), or indium zinc oxide (IZO) deposited by sputtering and may further include other layers to enhance injection of holes or electrons into organic layers of an OLED device, for example lithium deposited by evaporation. The electrically-conductive layer 17 may comprises a metal or metal alloy, for example silver, aluminum, or magnesium, or an alloy of silver, aluminum, or magnesium and may be deposited by sputtering or evaporation. As employed herein, a light-scattering layer 22 is an optical layer that tends to randomly redirect any light that impinges on the layer from any direction. As used herein, a transparent electrode or transparent conductive layer (used interchangeably herein) is one that passes some light and includes materials that are semi-transparent, partially reflective, or partially absorptive.

The light-scattering layer 22 may be made by depositing light-scattering materials in a patterned arrangement, for example, by employing inkjet deposition techniques. Alternative techniques are also possible, for example, by using surface treatments that provide a hydrophobic or hydrophilic patterned surface on which materials are deposited. The electrically-conductive layer 17 may then be coated over the light-scattering layer 22 and transparent, conductive layer 16, forming electrical connections with the transparent, conductive layer 16 in the areas 62 and through the electrically-conductive layer 22 in the areas 60. The preferred locations of areas 60 and/or 62 will depend on the specific structure of the LED device of which it is a part. In particular, the underlying layers of the LED device may determine the profile as illustrated in FIGS. 5a-5d and FIGS. 6a and 6b. It is possible that underlying layers specify the areas 60 and 62 and that only some portions of the transparent electrode 16 will be substantially planar. Alternatively, no portions of the transparent electrode may be substantially planar.

The protective layer 21 may be unpatterned and conductive and may comprise a metal oxide, for example, aluminum zinc oxide, indium tin oxide, or indium zinc oxide, with or without doping to enhance or modify the conductivity and protective capabilities of the protective layer 21. Such a layer may be structurally different from the transparent, conductive layer 16, for example by deposition through methods such as chemical vapor deposition (CVD) or atomic layer deposition (ALD) known in the art. Alternatively, the electrically-conductive, light-scattering layer 22 may be formed by uniformly coating a layer over the first and second portions, and pattern-wise removing the layer over the second portions. Photolithographic techniques may be employed and the scattering particles may be located in a binder or matrix that may itself be patternable, for example by employing curable resin. Layers deposited by such techniques have been demonstrated by applicant to provide a useful protective layer.

The present invention provides an advantage in that the conductive layers 16, 21, 22, and 17 need not be patterned. It is known that patterning suitably conductive materials in the presence of environmentally sensitive materials (e.g. organic materials) is difficult, particularly for sputtering and for evaporation, which may require precision mechanical masks. High process temperatures may also be required to provide adequate performance in such layers. It is easier to pattern the scattering layer, particularly in the presence of a protective layer 21, by employing deposition means such as inkjets or patterning methods compatible with the chemistry of the protective layer 21, for example by forming a solution comprising light-scattering particles in a matrix, uniformly coating the solution over the areas 60 and 62, and then using photo-lithographic techniques to pattern the scattering layer 22 by pattern-wise removing the coated layer over the second portions 62.

In further preferred embodiments, the protective layer 21 may have an optical refractive index greater than or equal to the optical refractive index of the transparent, conductive layer 16. For example, zinc oxide having an optical index (e.g. 1.95) greater than that of indium tin oxide (e.g. 1.8) may be employed. Alternatively, the protective layer 21 may have an optical refractive index within 10% of the optical refractive index of the transparent, conductive electrode. By employing layers having such refractive indices, light emitted from the organic layer(s) of an OLED device may travel through the transparent, conductive electrode 16 to be scattered by the electrically-conductive, light-scattering layer 22 and/or reflected from the electrically-conductive layer 17 rather than being internally reflected from the interface between the protective layer 21 and the transparent, conductive electrode 16 and thereby being trapped in the LED device. Reflected light may be waveguided within the protective layer 21, but will re-encounter the scattering layer 22 before the light has traveled a significant distance and re-scatter.

Referring to FIG. 6a, the present invention may be employed in a bottom-emitting active-matrix LED device. Such a device may employ active-matrix circuitry that includes thin-film electronic components 30 for driving an LED formed in a semi-conducting layer located over a transparent substrate 10. An interlayer insulating and planarizing layer 32 may be formed over the thin-film electronic components 30. A patterned, bottom transparent conductive electrode layer 12 may be formed over the substrate 10 with one or more layers 14 of light-emitting material formed over the bottom transparent layer 12. Individual transparent conductive electrodes formed in layer 12 may be separated by insulating layer 34. A low-index layer 18 formed under a supportive layer 24 may be employed to optically isolate the transparent electrode 12 from the substrate 10. Transparent electrode 16 is formed over light-emitting layers 14. Electrically-conductive, light-scattering layer 22 is formed between a transparent, conductive electrode 16 and a reflective, conductive layer 17 over only a first portion 60 of the transparent, conductive layer 16, wherein the electrically-conductive, light-scattering layer 22 is relatively less conductive than the reflective, conductive layer 17 and the reflective, conductive layer 17 is in electrical contact with the transparent, conductive electrode 16 over a second area 62 of the transparent, conductive electrode 16 where the electrically-conductive, light-scattering layer 22 is not formed. For such applications, only a coarse patterning of the scattering layer 22 may be necessary, provided the transparent conductive electrode 16 has adequate conductivity to conduct current from portions 62 to the entire extent of areas 60. Such coarse patterning may be especially useful when the present invention is employed in a passive-matrix configuration, for example in a low-resolution display, illumination lamp, or a backlight.

Figure 6B:
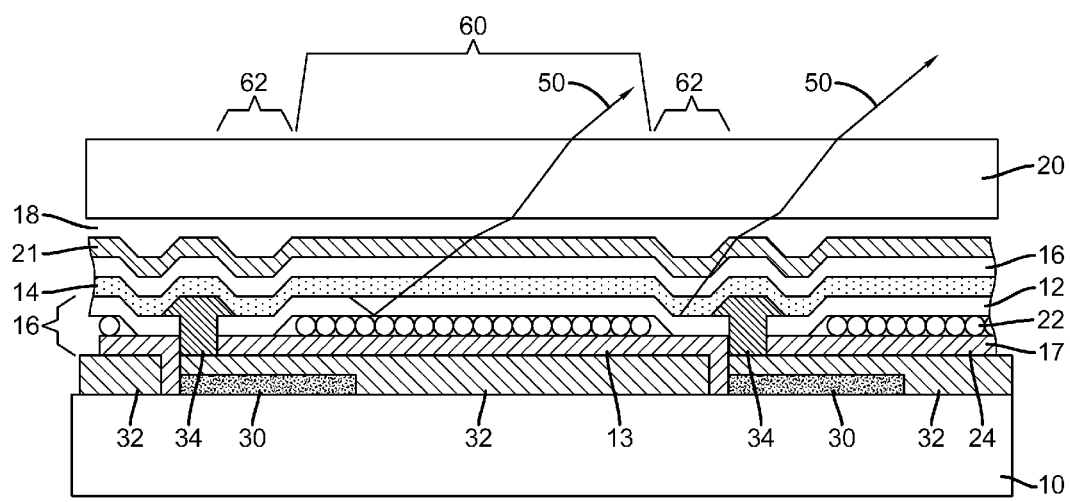
FIG. 6b is a partial cross section of a top-emitting LED device having a transparent electrode, patterned electrically-conductive, light-scattering layer, and an electrically-conductive layer according to an embodiment of the present invention.

Referring to FIG. 6b, the present invention may be employed in a top-emitting active-matrix LED device. Such a device may employ active-matrix circuitry that includes thin-film electronic components 30 for driving an LED formed in a semi-conducting layer located over a substrate 10. An interlayer insulating and planarizing layer 32 may be formed over the thin-film electronic components 30. A reflective conductor 17 may be formed over the substrate 10, an electrically-conductive light-scattering layer 22 formed over the reflective conductor 17, a transparent electrode 12 formed over the electrically-conductive, light-scattering layer 22, and one or more layers 14 of light-emitting material formed over the transparent electrode 12. A transparent top electrode 16 is formed over the light-emitting layers 14 and a protective layer 21 may be employed over the transparent electrode 16. A transparent cover 20 may be affixed to the substrate 10 to further protect the LED device. Low-index layer 18 serves to optically isolate the light-emissive layers 14 from the cover 20 to improve the sharpness of the LED device, as is disclosed in co-pending, commonly assigned US Publication 2006/

0186802, filed Feb. 24, 2005, the disclosure of which is hereby incorporated by reference in its entirety.

The optical isolation layer 18 may comprise a solid layer, a void, or a gap filled with air, helium, nitrogen, or argon. A suitable solid material, for example a low-index polymer, may be employed, but such solid material must have an optical index lower than that of the organic layers 14 and cover 20 or substrate 10 through which light is emitted. Preferably, the optical isolation layer 18 is at least one micron thick, and more preferably at least two microns thick. Since the low-index layer or gap 18 has an optical index lower than that of the LED elements and the cover or substrate through which light is emitted, any light that is scattered into the layer 18 by the scattering layer will pass through the low-index layer and the cover or substrate, since light passing from a low-index material (layer 18) into a higher index material (the cover or substrate) cannot experience total internal reflection, although it can still experience the much smaller Fresnel reflection.

As shown in FIG. 6b, the optical isolation layer 18 is formed between the protection layer 21 and the cover 20. To reduce reflection from the protective layer 21, the protective layer 21 preferably has an optical refractive index greater than or equal to the optical refractive index of the transparent electrode 16. Referring back to FIG. 6a, the optical isolation layer 18 is formed as a cavity between the planarization layer 32 and a supportive layer 24. The supportive layer 24 may be the same layer as the transparent, conductive layer 12. To reduce reflection from the protective layer 21 in the bottom-emitting embodiment of FIG. 6a, the protective layer 21 preferably has an optical refractive index greater than or equal to the optical refractive index of the transparent, conductive layer 15.

The electrically-conductive layer 17 when reflective (for example comprising silver or aluminum) can be very thick (for example greater than 100 nm) and carry large amounts of current. Since the electrically-conductive layer 17 is electrically connected to the transparent, conductive electrode 16 in portions 62, the current distribution in the LED device is thereby improved despite the relatively low conductivity of the transparent, conductive electrode 16 over the conductivity and the electrically-conductive, light-scattering layer 22.

For applications in which device sharpness is important (e.g. display devices having pixels), it is preferable that the optical isolation layer 18 (FIGS. 6a and 6b) provide an optically transparent layer having a refractive index lower than that of the layers adjacent to it, since light passing from a low-index medium (the optical isolation layer 18) into a higher-index medium (substrate 10 and underlying planarization and insulation layers 32 or cover 20) cannot experience total internal reflection and is emitted. Hence, light will not experience the losses due to repeated transmission through the substrate 10, or demonstrate the lack of sharpness that results from light being emitted from the organic layers 14 at one point and emitted from the substrate 10 at a distant point. To facilitate this effect, the optical isolation layer 18 should not itself scatter light, and should be as transparent as possible. The optical isolation layer 18 is preferably at least one micron thick to ensure that emitted light properly propagates through the optical isolation layer 18 and is transmitted through the substrate 10.

Whenever light crosses an interface between two layers of differing index (except for the case of total internal reflection), a portion of the light is reflected and another portion is refracted. Unwanted reflections can be reduced by the application of standard thin anti-reflection layers. Use of anti-reflection layers may be particularly useful on both sides of the transparent substrate 10.

In various embodiments of the present invention, the light-scattering particles 23 may have a relatively higher index of refraction than the average index of the remaining volume of the light-scattering layer 22. That is, the scattering particles 23 may be located in a relatively lower-index binder or formed on a surface (e.g. transparent electrode 16) in a vacuum or gas-filled cavity, such as cavity 18 of FIG. 6b. In another embodiment of the present invention, the light-scattering particles are non-spherical and randomly oriented. Such particle shapes and orientations effectively form a random scattering structure that scatters all light at every point on the surface of the transparent electrode thereby increasing the amount of high-angle trapped light that may be scattered at each encounter with the scattering layer 22. Such a randomizing effect reduces angular dependence for color and luminance of the emitted light, a useful property for most light-emitting devices such as displays and area illuminators, but may not be found in prior-art sparse, low-volume ratio scattering layers. In further preferred embodiments of the present invention, the light-scattering layer 22 is in direct optical contact with the transparent electrode 16. Direct optical contact means that no higher-index layers are formed between the scattering layer 22 and the transparent electrode 16. Alternatively, layers with a lower optical index, for example, transparent protective layers, may be employed between the scattering layer 22 and the transparent electrode 16.

According to the present invention, the electrically-conductive, light-scattering particles 23 may comprise a variety of materials, as may the remainder of the volume not occupied by the light-scattering particles. For example, randomly located spheres of indium tin oxide may be employed in a matrix of polymeric material. Alternatively, a more structured arrangement may be used. Shapes of refractive elements may be cylindrical, rectangular, rutile, or spherical, but it is understood that the shape is not limited thereto. In a preferred embodiment of the present invention, the majority of the remaining volume may be a gas or vacuum. Preferably, air or an inert gas is employed. When coated with an additional electrically-conductive layer 17 using a process such as sputtering, for example, the remaining volume may remain gas or vacuum, since sputtering is a directional deposition process that may effectively coat a surface but may not infiltrate into crevices between electrically-conductive, light-scattering particles 23, thereby maintaining a high-refractive-index difference between the particles 23 and the remaining volume and enhancing the scattering effect of the scattering layer 22. The difference in refractive indices between materials in the scattering layer 22 may be, for example, from 0.3 to 3, and a large difference is generally desired. The thickness of the scattering layer, or size of features in, or on the surface of, a scattering layer may be, for example, 0.03 to 50 μm although a thickness of less than one micron may be preferred to minimize absorption and maximize compatibility with other elements of a display device. It is generally preferred to avoid diffractive effects in the scattering layer. Such effects may be avoided, for example, by locating features randomly or by ensuring that the sizes, shapes or distribution of the refractive elements vary and/or are not the same as the wavelength of the color of light emitted by the device from the light-emitting area.

Figure 7:
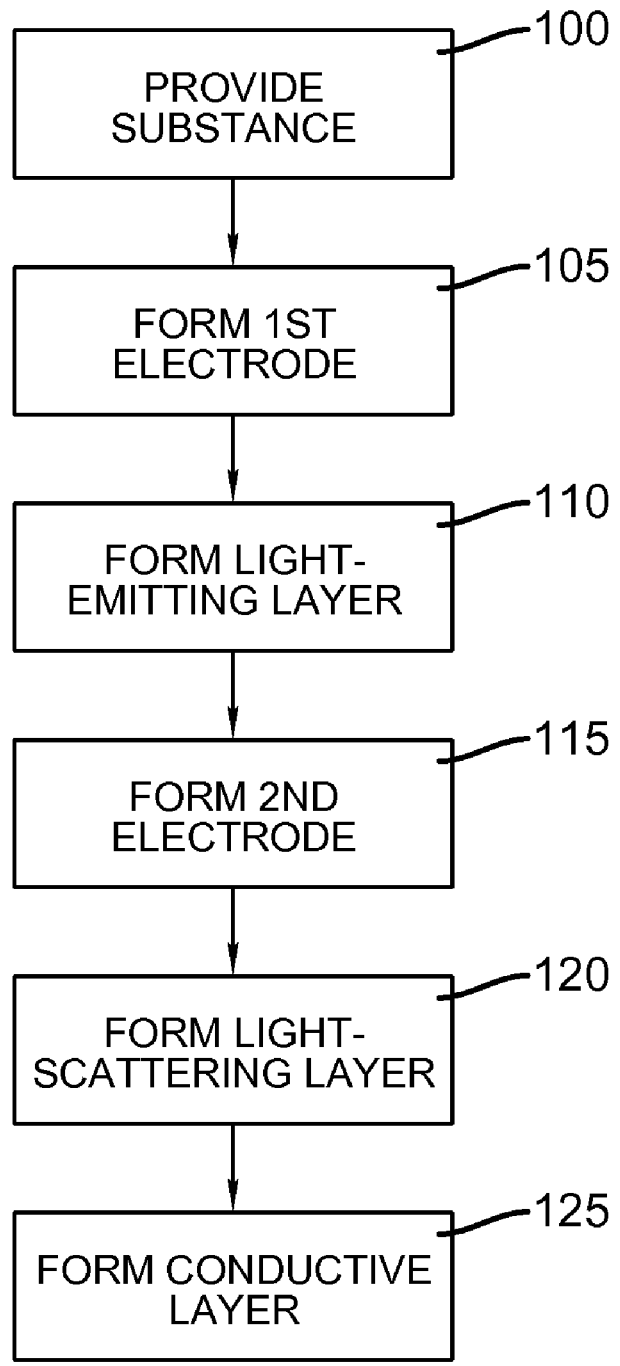
FIG. 7 is a flow diagram illustrating a method of making the present invention.
Figure 8A:
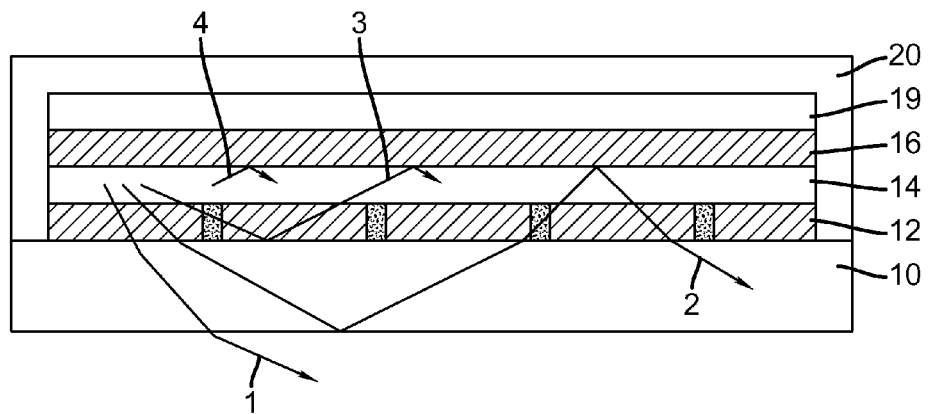
FIGS. 8a and 8b are prior-art cross sections of an LED device illustrating light trapping.
Figure 8B:
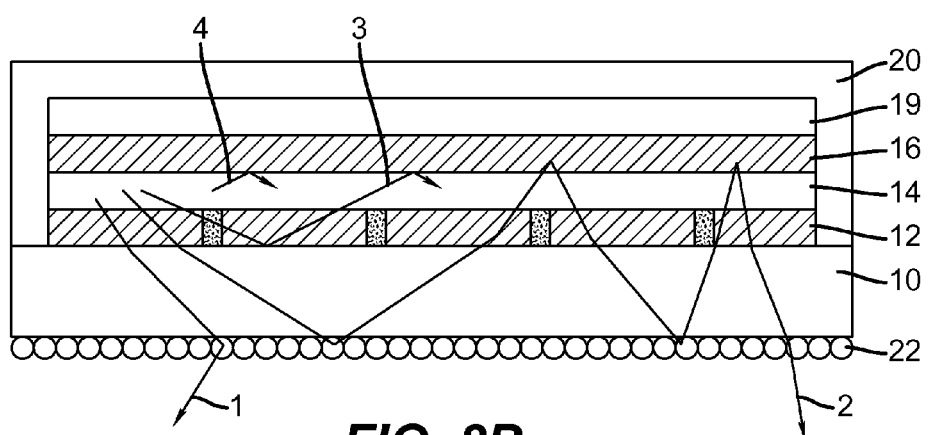

In accordance with an embodiment of the present invention and illustrated in FIG. 7, the LED device may be formed by providing 100 a substrate, forming 105 a first electrode over the substrate, forming 110 a light-emitting layer over the first electrode, forming 115 a second electrode over the light-emitting layer, wherein at least one of the first and second electrodes is transparent, and forming 120 a light-scattering layer comprising electrically conductive, light-scattering particles in electrical contact with the first or second electrode. In a further embodiment, an electrically-conductive layer 17 may be formed 125 over the light-scattering layer.

The light-scattering layer may be formed by coating a dispersion, including an evaporable solvent together with light-scattering, electrically-conductive particles, such as ITO particles. Additional materials may be included in the dispersion to further enhance the method or the effectiveness of the resulting layer. For example, surfactants or binders, may be employed. In particular, a binder having a refractive optical index less than the refractive index of the light-scattering, electrically-conductive particles 23 and having a weight less than 10% of the weight of the light-scattering, electrically-conductive particles 23 may be employed. Such binders, for example, comprising urethane, have been demonstrated by the Applicant to effectively act as both a surfactant and a means to adhere the light-scattering, electrically-conductive particles 23 to an electrode. Referring to FIG. 1, a dried layer 22 of light-scattering, electrically-conductive particles 23 is formed on the transparent electrode 16.

In an alternative embodiment of the present invention, a binder may be added to a dispersion comprising light-scattering, electrically-conductive particles 23 and an admixture of transparent, high-index, nano-particles to form a high-optical-index layer formed over transparent electrode 16. In this case, the binder and nano-particles may form a smooth, planar layer adjacent to transparent electrode 16. Applicant has formed such high-index nano-particles to form transparent high-index layers. The high-index nano-particles may not scatter light but may enhance the optical coupling between the light-scattering, electrically-conductive particles 23 and the transparent electrode 16. The nano-particles may have an optical index different than that of the light-scattering, electrically-conductive particles 23.

OLED devices of this invention can employ various well-known optical effects in order to enhance their properties, if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST 1, 2, 3, 4 light rays
10 substrate
12 electrode
14 organic layer(s)
15 transparent layer
16 electrode
17 reflective conductor
18 optical isolation layer
19 gap
20 cover
21 protective layer
22 scattering layer
23 scattering particle
24 supportive layer
30 thin-film electronic components
32 planarizing layer
34 insulating layer
50 light-emitting area
51 light ray
55 device side
60 area
62, 62' area
90 transparent particle
92 reflective particle 100 provide substrate step
105 form first electrode step
110 form light-emitting layer step
115 form second electrode step
120 form light-scattering layer step
125 form conductive layer step

The invention claimed is:

1. A light-emitting device, comprising:
   a) a substrate;
   b) a first electrode formed over the substrate;
   c) a light-emitting layer formed over the first electrode;
   d) a second electrode formed over the light-emitting layer, wherein at least one of the first and second electrodes is transparent;
   e) a light-scattering electrically conductive area on a side of the second electrode and opposite the light-emitting layer, the light-scattering electrically conductive area comprising electrically-conductive, light-scattering particles located in physical and electrical contact with the second electrode, wherein part of the light-scattering electrically conductive area is unoccupied by the light-scattering particles, the unoccupied area consisting of gas or vacuum,
   f) forming a transparent, electrically-conductive layer or a reflective, electrically-conductive layer over and directly in contact with the light-scattering electrically-conductive area.

2. The light-emitting device of claim 1, wherein the light-emitting layer comprises organic materials.

3. The light-emitting device of claim 1, wherein the light-emitting layer comprises inorganic light-emitting particles.

4. The light-emitting device of claim 3, wherein the light-emitting layer comprises core/shell quantum dots in a semiconductor matrix.

5. The light-emitting device of claim 1, wherein the electrically-conductive, light-scattering particles are metal oxide particles.

6. The light-emitting device of claim 1, wherein the electrically-conductive, light-scattering particles are indium tin oxide, indium zinc oxide, or aluminum zinc oxide particles.

7. The light-emitting device of claim 1, wherein the second electrode is transparent and the electrically conductive, light-scattering particles are adjacent to, and in electrical contact with, the second electrode.

8. The light-emitting device of claim 1, wherein the light-scattering electrically conductive area is patterned so that the light scattering particles are present in some locations over the substrate and absent in other locations over the substrate.

9. The light-emitting device of claim 1, wherein the electrically-conductive, light-scattering particles comprise reflective particles.

10. The light-emitting device of claim 1, wherein the electrically-conductive, light-scattering particles have an asymmetric shape.

11. The light-emitting device of claim 1, wherein the electrically-conductive, light-scattering particles are transparent, refractive particles.

12. The light-emitting device of claim 11, wherein the transparent refractive particles have an optical index equal to or greater than the optical index of the light-emitting layer.

13. A method of making a light-emitting device, comprising the steps of:
  a) providing a substrate;
  b) forming a first electrode over the substrate;
  c) forming a light-emitting layer over the first electrode;
  d) forming a second electrode over the light-emitting layer, wherein at least one of the first and second electrodes is transparent;
  e) forming a light-scattering electrically-conductive area on a side of the second electrode and opposite the light-emitting layer, the light-scattering electrically conductive area comprising electrically conductive, light-scattering particles located in physical and electrical contact with the second electrode, wherein part of the light-scattering electrically conductive area is unoccupied by the light-scattering particles, the unoccupied area consisting of gas or vacuum, and
  f) forming a transparent, electrically-conductive layer or a reflective, electrically-conductive layer over and directly in contact with the light-scattering electrically-conductive area.

14. The method of claim 13, wherein the electrically-conductive, light-scattering particles comprise reflective particles.

15. The method of claim 13, wherein the electrically-conductive, light-scattering particles are transparent, refractive particles.

16. The method of claim 15, wherein the transparent refractive particles have an optical index equal to or greater than the optical index of the light-emitting layer.

* * * * *